(12) United States Patent
Kline

(10) Patent No.: US 7,488,900 B1
(45) Date of Patent: Feb. 10, 2009

(54) GASKETS FOR PROVIDING ENVIRONMENTAL SEALING AND/OR ELECTROMAGNETIC INTERFERENCE (EMI) SHIELDING

(75) Inventor: James E. Kline, Blairstown, NJ (US)

(73) Assignee: Laird Technologies, Inc., Chesterfield, MO (US)

( * ) Notice: Subject to any disclaimer, the term of this patent is extended or adjusted under 35 U.S.C. 154(b) by 193 days.

(21) Appl. No.: 11/526,275

(22) Filed: Sep. 22, 2006

(51) Int. Cl.
*H05K 9/00* (2006.01)

(52) U.S. Cl. ................ 174/355; 174/358; 277/920

(58) Field of Classification Search ............... 174/356, 174/357, 358, 355; 361/816, 818; 277/920
See application file for complete search history.

(56) References Cited

U.S. PATENT DOCUMENTS

| | | | |
|---|---|---|---|
| 2,736,076 A | 2/1956 | Bush et al. | |
| 2,942,308 A | 6/1960 | Naeser et al. | |
| 2,954,592 A | 10/1960 | Parsons | |
| 4,857,668 A | 8/1989 | Buonanno | |
| 4,884,368 A | 12/1989 | Thornley et al. | |
| 5,120,087 A | 6/1992 | Pastva | |
| 5,532,426 A | 7/1996 | Blum et al. | |
| 6,075,205 A | 6/2000 | Zhang | |
| 6,235,986 B1 | 5/2001 | Reis et al. | |
| 6,505,839 B1 | 1/2003 | Nishimuro et al. | |
| 6,621,000 B2 | 9/2003 | Jensen et al. | |
| 6,858,794 B2 | 2/2005 | Jensen et al. | |
| 7,340,862 B2 * | 3/2008 | Baratin et al. ............... | 49/479.1 |
| 2002/0050692 A1 | 5/2002 | Nishimuro et al. | |
| 2003/0037943 A1 | 2/2003 | Jensen et al. | |
| 2003/0201111 A1 | 10/2003 | Jensen et al. | |
| 2003/0209355 A1 | 11/2003 | Jensen etal. | |
| 2004/0261322 A1 | 12/2004 | Baratin et al. | |

FOREIGN PATENT DOCUMENTS

| | | |
|---|---|---|
| EP | 0998177 | 5/2000 |
| GB | 835484 | 5/1960 |
| GB | 852214 | 10/1960 |
| JP | 2000-307257 | 11/2000 |
| JP | 2001-007583 | 1/2001 |
| WO | WO 2005/004573 | 1/2005 |

OTHER PUBLICATIONS

Laird Technologies catalog titled Elastomeric EMI Shielding Solutions, accessed and printed on Sep. 22, 2006 from http://www.lairdtech.com/downloads/ECECatalog.pdf; 56 pages.

* cited by examiner

*Primary Examiner*—Hung V Ngo
(74) *Attorney, Agent, or Firm*—Harness, Dickey & Pierce, P.L.C.

(57) ABSTRACT

A gasket generally includes a base member having an inner surface and an outer surface, and a top member having an inner surface and an outer surface. The gasket also has first and second oppositely-disposed lateral members curving generally inwardly relative to each other and connecting the base member to the top member such that a spaced distance separates the base member's inner surface from the top member's inner surface. The first and second lateral members, base member, and top member collectively define a generally trapezoidal profile with four generally rounded corner portions at about the intersections of the first and second lateral members with the base member and top member.

25 Claims, 16 Drawing Sheets

GASKETS FOR PROVIDING ENVIRONMENTAL SEALING AND/OR ELECTROMAGNETIC INTERFERENCE (EMI) SHIELDING

FIELD

The present disclosure generally relates to gaskets for providing environmental sealing and/or electromagnetic interference (EMI) shielding.

BACKGROUND

The statements in this section merely provide background information related to the present disclosure and may not constitute prior art.

Electrically-conductive elastomer seals and gasket products sometimes are configured to provide electromagnetic interference (EMI) shielding and provide environmental sealing. For example, a seal or gasket may be required to keep out contaminates, such as dust and moisture. Other times, a seal or gasket may be required to hold back a pressure differential, as in the case of a submersible camera.

Gaskets and seals have also been developed for use in gaps and around doors to provide a degree of EMI shielding while permitting operation of enclosure doors and access panels and fitting of connectors. To shield EMI effectively, the gasket should be capable of absorbing or reflecting EMI as well as establishing a continuous electrically conductive path across the gap in which the gasket is disposed. These gaskets can also be used for maintaining electrical continuity across a structure and for excluding from the interior of the device such contaminates as moisture and dust. Once installed, the gaskets essentially close or seal any interface gaps and establish a continuous electrically-conductive path thereacross by conforming under an applied pressure to irregularities between the surfaces. Accordingly, gaskets and seals intended for EMI shielding applications are specified to be of a construction that not only provides electrical surface conductivity even while under compression, but which also has a resiliency allowing the seals to conform to the size of the gap.

As used herein, the term "EMI" should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

SUMMARY

According to various aspects, exemplary embodiments are provided of gaskets. In one exemplary embodiment, the gasket generally includes a base member having an inner surface and an outer surface, and a top member having an inner surface and an outer surface. The gasket also has first and second oppositely-disposed lateral members curving generally inwardly relative to each other and connecting the base member to the top member such that a spaced distance separates the base member's inner surface from the top member's inner surface. The first and second lateral members, base member, and top member collectively define a generally trapezoidal profile with four generally rounded corner portions at about the intersections of the first and second lateral members with the base member and top member.

Another exemplary embodiment includes a gasket that is deflectable into a collapsed orientation between first and second surfaces. The gasket generally includes a resilient, electrically-conductive tubular body of indefinite length. The tubular body has a generally continuous interior and exterior surface defining a wall thickness therebetween. The gasket also includes a base member, a top member, and first and second lateral members. The top member has a narrower width than the base member. The first and second lateral members curve slightly inwardly relative to each other and connect the base member to the top member such that the gasket has a generally trapezoidal profile collectively defined by the first and second lateral members, base member, and top member. In this particular embodiment, the gasket is configured to seal against EMI and an air pressure differential of at least about 6.4 pounds per square inch when the base member is secured with adhesive to the second surface and the first surface is engaging the top member and compressing the gasket to a gap between about 0.295 inch to about 0.185 inch. This particular gasket embodiment is also configured to seal against EMI and an air pressure differential of at least about 8.6 pounds per square inch without exceeding a gasket force of about thirty-two pounds per inch of gasket length when the base member is secured with adhesive to the second surface and the first surface is engaging the top member and compressing the gasket to a gap between about 0.185 inch to about 0.134 inch.

A further exemplary embodiment includes a gasket for interposition between first and second surfaces. The gasket includes a resilient, tubular body of indefinite length. The tubular body has generally continuous interior and exterior surfaces defining a wall thickness therebetween. The gasket also includes a base member having an inner surface forming a first portion of the interior surface of the body and an outer surface forming a first portion of the exterior surface of the body for contact with the second surface. The gasket additionally includes a top member narrower in width than the base member. The top member has an inner surface forming a second portion of the interior surface of the body, and an outer surface forming a second portion of the exterior surface of the body for contact with the first surface. The gasket further includes first and second oppositely-disposed lateral members connecting the base member to the top member such that a spaced distance separates the base member's inner surface from the top member's inner surface and such that the base member's outer surface conforms to the second surface, with the top member's outer surface generally parallel to the first surface. The first and second lateral members extend from corresponding edge portions of the top member to intersect corresponding edge portions of the base member such that the first and second lateral members, base member, and top member collectively define a generally trapezoidal profile having four generally rounded corner portions at about the intersections of the first and second lateral members with the base member and top member. The first and second lateral members have a generally convex curvature and bow inwardly relative to each other as the first and second lateral members extend from the top member to intersect the base member. The first lateral member has an outer surface forming a third portion of the exterior surface of the body, and an inner surface forming a third portion of the interior surface of the body and defining a first angle with the inner surface of the base member and a second angle with the inner surface of the top member. The second lateral member has an outer surface forming a fourth portion of the exterior surface of the body, and an inner surface forming a fourth portion of the interior surface of the body and defining a third angle with the inner surface of the base member and a fourth angle with the inner surface of the top member.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
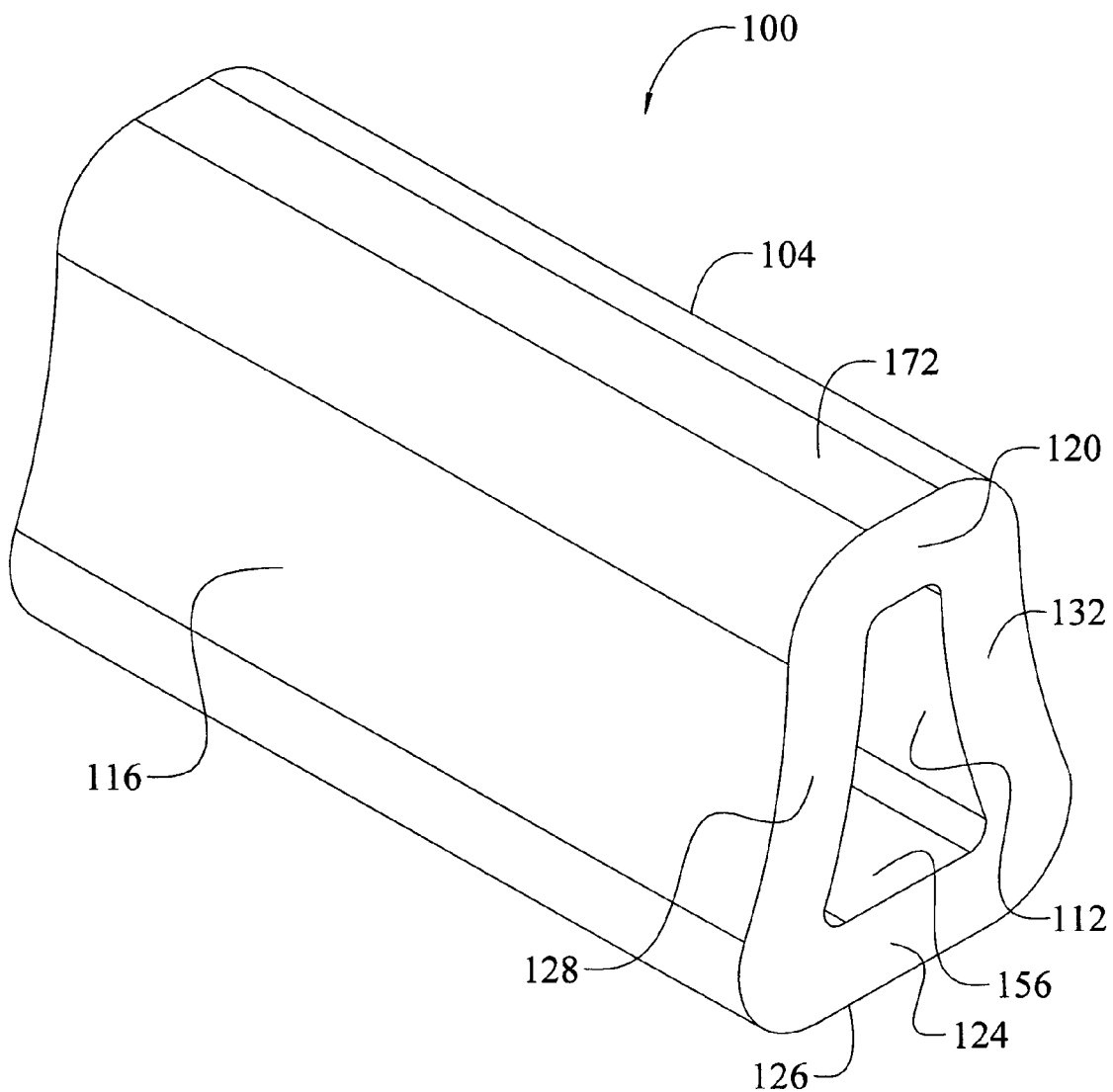
FIG. 1 is a perspective end view of an exemplary embodiment of an EMI shielding and/or environmental sealing gasket according to exemplary embodiments.

The following description is merely exemplary in nature and is in no way intended to limit the present disclosure, application, or uses. It should be understood that throughout the drawings, corresponding reference numerals indicate like or corresponding parts and features.

According to various aspects, exemplary embodiments are provided of gaskets. In one exemplary embodiment, the gasket generally includes a base member having an inner surface and an outer surface, and a top member having an inner surface and an outer surface. The gasket also has first and second oppositely-disposed lateral members curving generally inwardly relative to each other and connecting the base member to the top member such that a spaced distance separates the base member's inner surface from the top member's inner surface. The first and second lateral members, base member, and top member collectively define a generally trapezoidal profile with four generally rounded corner portions at about the intersections of the first and second lateral members with the base member and top member.

Another exemplary embodiment includes a gasket that is deflectable into a collapsed orientation between first and second surfaces. The gasket generally includes a resilient, electrically-conductive tubular body of indefinite length. The tubular body has a generally continuous interior and exterior surface defining a wall thickness therebetween. The gasket also includes a base member, a top member, and first and second lateral members. The top member has a narrower width than the base member. The first and second lateral members curve slightly inwardly relative to each other and connect the base member to the top member such that the gasket has a generally trapezoidal profile collectively defined by the first and second lateral members, base member, and top member. In this particular embodiment, the gasket is configured to seal against EMI and an air pressure differential of at least about 6.4 pounds per square inch when the base member is secured with adhesive to the second surface and the first surface is engaging the top member and compressing the gasket to a gap between about 0.295 inch to about 0.185 inch. This particular gasket embodiment is also configured to seal against EMI and an air pressure differential of at least about 8.6 pounds per square inch without exceeding a gasket force of about thirty-two pounds per inch of gasket length when the base member is secured with adhesive to the second surface and the first surface is engaging the top member and compressing the gasket to a gap between about 0.185 inch to about 0.134 inch.

A further exemplary embodiment includes a gasket for interposition between first and second surfaces. The gasket includes a resilient, tubular body of indefinite length. The tubular body has generally continuous interior and exterior surfaces defining a wall thickness therebetween. The gasket also includes a base member having an inner surface forming a first portion of the interior surface of the body and an outer surface forming a first portion of the exterior surface of the body for contact with the second surface. The gasket additionally includes a top member narrower in width than the base member. The top member has an inner surface forming a second portion of the interior surface of the body, and an outer surface forming a second portion of the exterior surface of the body for contact with the first surface. The gasket further includes first and second oppositely-disposed lateral members connecting the base member to the top member such that a spaced distance separates the base member's inner surface from the top member's inner surface and such that the base member's outer surface conforms to the second surface, with the top member's outer surface generally parallel to the first surface. The first and second lateral members extend from corresponding edge portions of the top member to intersect corresponding edge portions of the base member such that the first and second lateral members, base member, and top member collectively define a generally trapezoidal profile having four generally rounded corner portions at about the intersections of the first and second lateral members with the base member and top member. The first and second lateral members have a generally convex curvature and bow inwardly relative to each other as the first and second lateral members extend from the top member to intersect the base member. The first lateral member has an outer surface forming a third portion of the exterior surface of the body, and an inner surface forming a third portion of the interior surface of the body and defining a first angle with the inner surface of the base member and a second angle with the inner surface of the top member. The second lateral member has an outer surface forming a fourth portion of the exterior surface of the body, and an inner surface forming a fourth portion of the interior surface of the body and defining a third angle with the inner surface of the base member and a fourth angle with the inner surface of the top member.

Accordingly, various embodiments of gaskets are disclosed that are capable of providing electromagnetic interference (EMI) shielding, environmental sealing, and/or holding back a pressure differential. Advantageously, some embodiments provide gaskets having the ability to provide a minimum force (or at least relatively low force) necessary for electrical contact and the desired form(s) of environmental sealing across a range of compression, including a relatively small percentage compression to a relatively large percentage compression, while not exceeding a maximum allowable gasket force at the large percentage compression. Some of these embodiments (and/or alternative embodiments) may also be useful for sealing against a pressure differential. Any one or more of the various gasket embodiments disclosed herein can be used in a wide range of applications to provide EMI shielding, environmental sealing, and/or sealing against a pressure differential. By way of example, a gasket disclosed herein can be used with submersible devices, such as cameras and vehicles, as well as other enclosures intended to protect equipment from the ingress of driven rain, pooled liquids, sand, dust, and/or pressure changes, etc.

In regard to gaps associated with structures, manufacturing variability, thermal expansion/contraction, assembly stresses, and vibration often combine to require a gasket design that is capable of functioning over a wide range of potential gap sizes. These demands, however, are usually inapposite with other demands, such as cost, weight, and size restrictions. Accordingly, a gasket design capable of satisfying all of these demands will have excellent applicability for providing gasketing solutions across a very broad spectrum.

In one aspect of the present disclosure, the inventor hereof were faced with the particularly daunting task of developing gaskets capable of satisfying the following set of fairly rigorous requirements:

a base member that allows the gasket to be adhesively mounted (e.g., with a pressure sensitive adhesive, etc.) to a surface, such as a generally flat and planar surface, a surface with a compound curvature, etc.;

compression between generally locally parallel opposing surfaces (or initially nonparallel substrate surfaces such as a closing hinged door), which may engage the gasket such that the compression may be normal with zero degree shear motion up to a shear angle of fifty-one degrees (e.g., forty-five degree shear means equal compression and lateral components of motion);

substantially continuous electrical contact along the path of the gasket from a gap of 0.295 inch down to a gap of 0.134 inch;

substantially continuous sealing against both EMI and an air pressure differential of at least 6.4 pounds per square inch (across the width of the gasket cross-section) when the gasket is compressed for fitting within a gap ranging in size from 0.295 inch to 0.185 inch;

substantially continuous sealing against EMI and an air pressure differential of at least 8.6 pounds per square inch when the gasket is compressed for fitting within a gap ranging in size from 0.185 inch to 0.134 inch gap;

gasket force not exceeding thirty-two pounds per inch of gasket length over a range of compression from 0.295 inch gap to 0.134 inch gap;

during compression, gasket overall width or lateral expansion that is minimized or significantly reduced;

gasket capable of functioning for at least tens of compression cycles;

gasket capable of functioning when made to traverse and follow a curved path having a minimum centerline radius of 0.825 inch;

gasket material that is fuel-tolerant such that the gasket won't degrade in the presence of jet fuel and/or liquids used for nuclear-biological-chemical wash down; and gasket capable of functioning between temperature extremes of minus fifty-five degrees Celsius and one hundred sixty degrees Celsius.

To this end, the inventor hereof succeeded in developing various embodiments of gaskets capable of satisfying the above-listed criteria.

Figure 2:
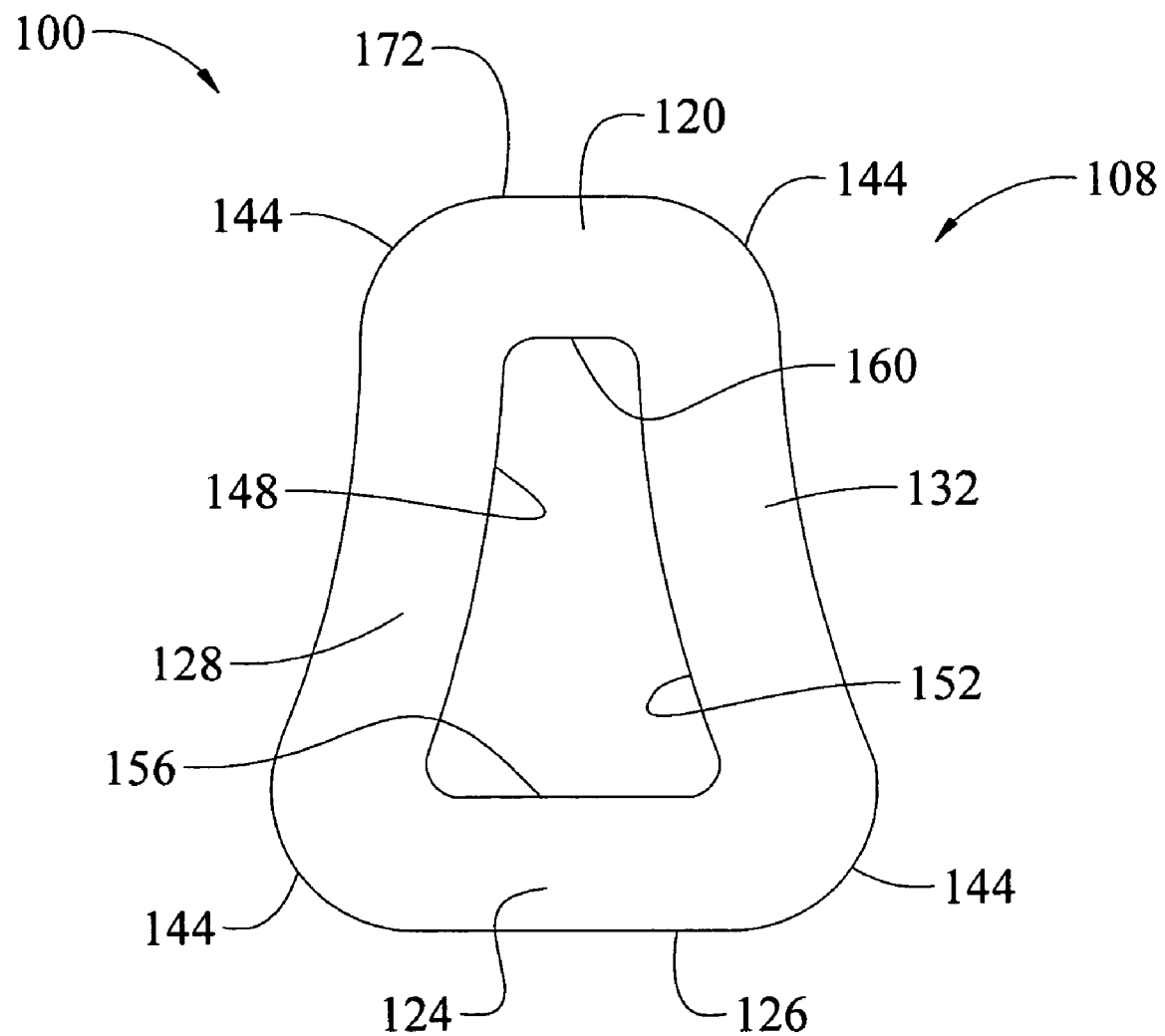
FIG. 2 is an end elevation view of the gasket shown in FIG. 1.

With reference now to FIGS. 1 and 2, a description will now be provided of an exemplary embodiment of a gasket 100 capable of meeting the fairly rigorous criteria mentioned above. In this particular embodiment, the gasket 100 includes a tubular or annular body 104. The body 104 has a closed generally trapezoidal cross-sectional geometry 108. The body 104 has continuous interior and exterior surfaces 112, 116 defining wall thicknesses therebetween.

As noted below in regard to FIG. 3, a preferred embodiment of the gasket 100 includes a thickness T1 of about 0.062 inch (with a tolerance of about +/−0.005 inch), a thickness T2 of about 0.065 inch (with a tolerance of about +/−0.005 inch), a thickness T3 of about 0.065 inch (with a tolerance of about +/−0.005 inch), and a thickness T4 of about 0.065 inch (with a tolerance of about +/−0.005 inch). Advantageously, some embodiments provide the top member with a wall thickness greater than the wall thickness of the base member in order to minimize (or at least reduce) the compressive force at the lower gap sizes (e.g., 0.134 inch gap, etc.) by delaying the abutting contact (e.g., 164 and 168 shown in FIG. 4 and described below), thus extending the deflection range over which the gasket force remains relatively constant. Alternatively, other wall thickness can be employed, and some embodiments may include a gasket having a generally uniform wall thickness completely therearound for ease of manufacturing.

With continued reference to FIG. 2, the gasket 100 includes a top member 120, a base member 124, and first and second lateral members 128, 132. These four members 120, 124, 128, 132 cooperatively define the approximately trapezoidal gasket profile 108. As shown in FIG. 2, the base member 124 is wider than the top member 120. The first and second lateral members 128 and 132 are bowed, arced, or curved slightly inwardly relative to each other.

The gasket 100 may be configured for interposition between first and second surfaces (e.g., surfaces 136, 140 as shown in FIG. 4, etc.). In some preferred embodiments, the base member 124 is configured such that its outer surface 126 will conform to a second surface, while the outer surface 160 of the top member 124 is generally parallel with an upper surface. In the embodiment illustrated in FIG. 1, the top and base members 120, 124 are generally parallel to each other. In addition, the outer surface 126 of the base member 124 is shown generally flat. Likewise, the outer surface 160 of the top member 124 is also show generally flat. In other embodiments, either or both of these outer surfaces may be configured differently depending, for example, on the particular application. For example, some embodiments may have the gasket's top and/or base member being bowed, arced, or curved slightly inwardly.

The lateral members 128, 132 are connected to the top and base members 120, 124 such that the gasket 100 includes four generally rounded or curved corner portions or intersections 144. The lateral members 128, 132 extend from the top member 120 to intersect the base member 124. The lateral members 128, 132 convexly curve or bow generally inwardly towards each other.

In some preferred embodiments, an acute angle is defined generally between the inner surface 148, 152 of each lateral member 128, 132 and the inner surface 156 of the base member 124. Alternative embodiments, however, may include an obtuse angle or a right angle defined generally between the inner surface 148, 152 of each lateral member 128, 132 and the inner surface 156 of the base member 124. In addition, some embodiments are configured such that the angles defined generally between the inner surface 148, 152 of each lateral member 128, 132 and the inner surface 156 of the base member 124 are not the same size.

In some preferred embodiments, an obtuse angle is defined generally between the inner surface 148, 152 of each lateral member 128, 132 and the inner surface 160 of the top member 120. Alternative embodiments, however, may include an obtuse angle or a right angle defined generally between the inner surface 148, 152 of each lateral member 128, 132 and the inner surface 160 of the top member 120. In addition, some embodiments are configured such that the angles defined generally between the inner surface 148, 152 of each lateral member 128, 132 and the inner surface 160 of the top member 120 are not the same size.

Depending on the particular installation, the outer surface 126 of the gasket's base member 124 may be secured to a support surface with adhesive (e.g., pressure sensitive adhesive, glue, double-sided tape, etc.). Alternatively, other suitable attachment methods can also be employed depending, for example, on the particular location or gap in which the gasket 100 will be installed.

By way of example, the gasket 100 may be installed within a gap between two generally parallel and opposing substrate surfaces (e.g., surfaces 136 and 140 shown in FIG. 4, etc.). The outer surface 126 of the gasket's base member 124 may be adhered to one of the two substrate surfaces, and the outer surface 172 of the gasket's top member 120 may be engaged by the other substrate surface to compress the gasket 100.

The body 104 preferably includes a generally hollow extrusion of elastomer material. In various embodiments, the gasket 100 is formed by extruding an electrically-conductive elastomer material, such as silicone or fluorosilicone rubber rendered electrically-conductive by its loading with a silver-based filler and/or a nickel-based filler. Alternatively, a wide range of other materials can also be used for the gasket 100, including dielectric elastomeric materials. Likewise, other manufacturing processes besides extrusion can also be employed, such as molding, die-cutting, etc. In this regard, die-cutting may involve forming the gasket from a cured sheet of an electrically-conductive elastomer, which is cut or stamped using a die or the like into the desired configuration. Molding, in turn, may involve the compression, transfer, or injection molding of an uncured or thermoplastic elastomer into the desired configuration. The materials and manufacturing processes described herein are illustrative only, as the gasket 100 can be formed from different materials and/or by different manufacturing processes.

Figure 5:
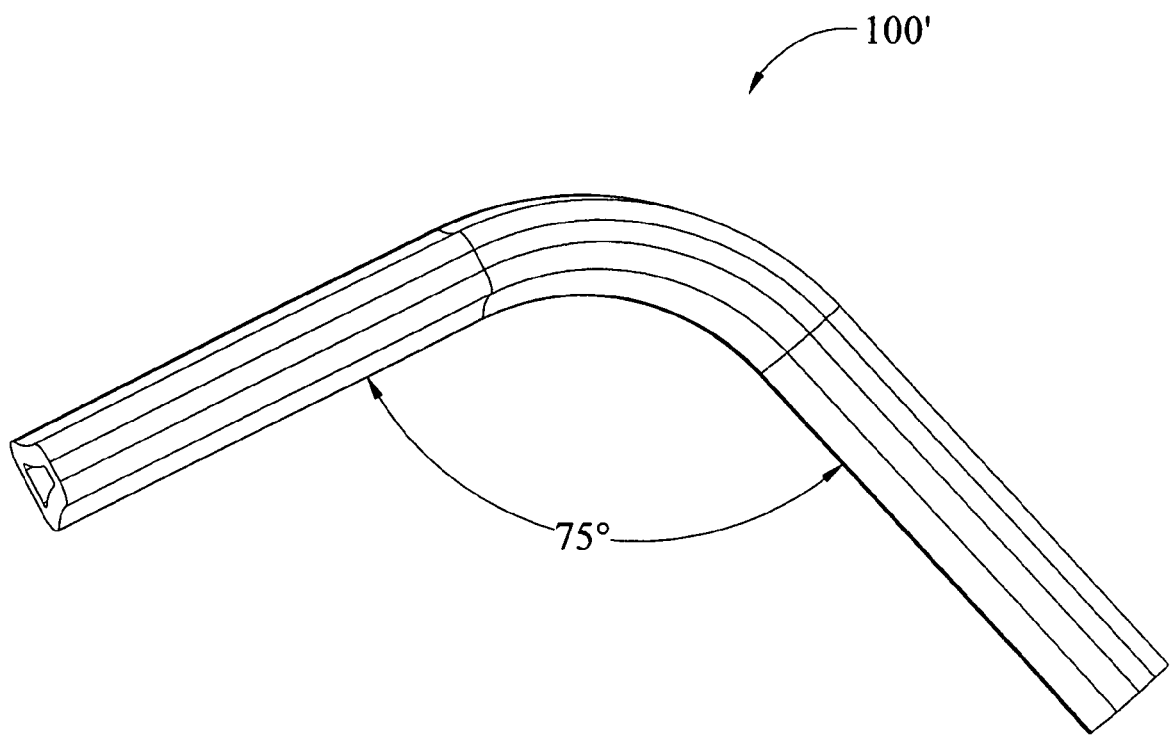
FIG. 5 is a perspective view of a seventy-five degree curved length of gasket having the profile shown in FIG. 2 according to exemplary embodiments.
Figure 6:
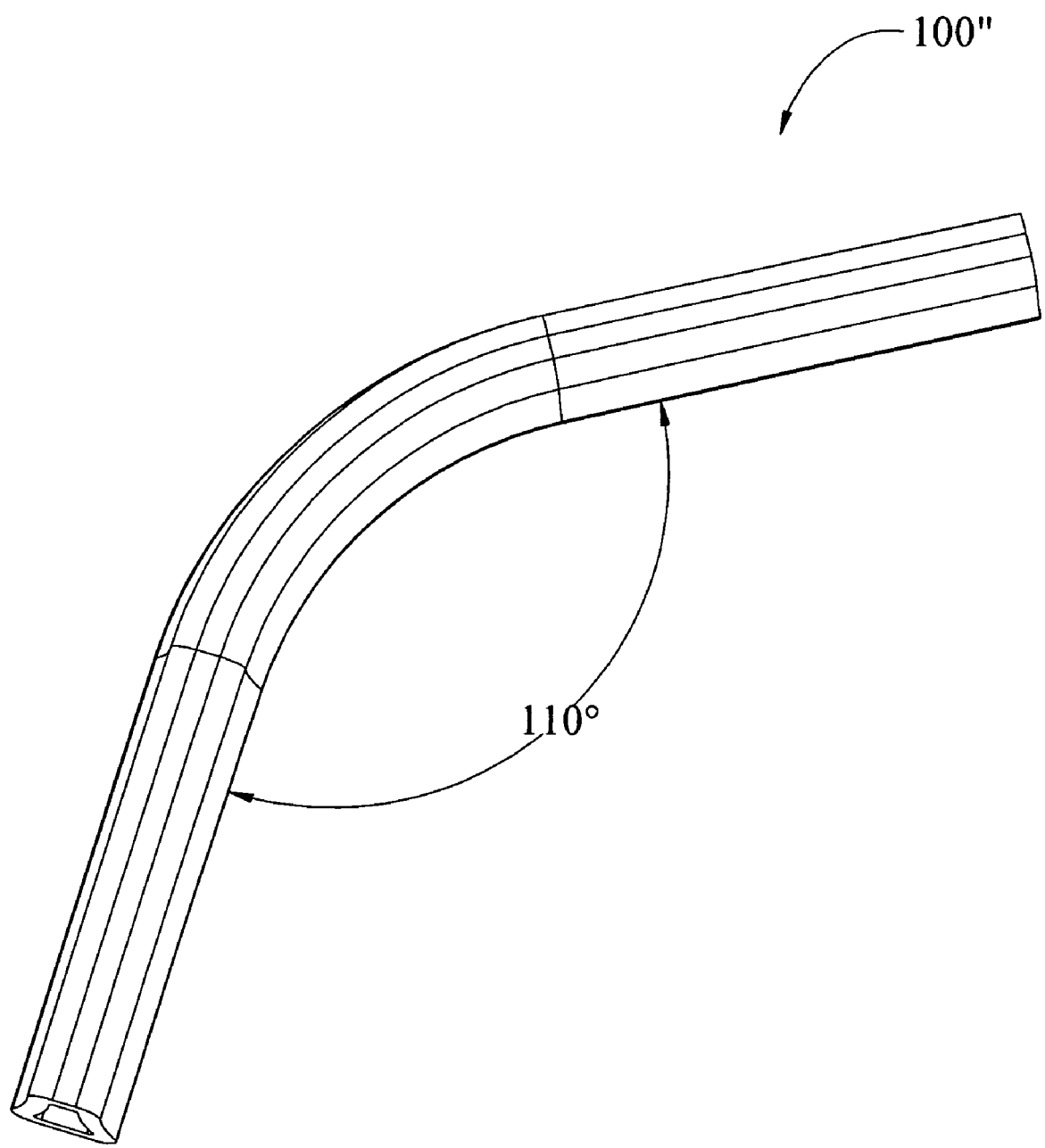
FIG. 6 is a perspective view of a one hundred ten degree curved length of gasket having the profile shown in FIG. 2 according to exemplary embodiments.

With continued reference to FIG. 1, the body 104 is shown having indefinite length. The gasket 100, however, may be cut, sectioned, or otherwise terminated for a custom fit at a particular location. In other words, the length of the gasket 100 can vary depending on the intended use of the gasket 100. The gasket 100 can be provided with a relative straight gasket length (FIG. 1), or the gasket 100 can be provided with a curved gasket length (e.g., FIGS. 5 and 6, etc.). For example, FIG. 5 illustrates an exemplary gasket 100′ having a seventy-five degree curved gasket length that is about 4.74 inches long with a plan view gasket centerline radius of curvature of 0.825 inch. FIG. 6 illustrates an exemplary gasket 100″ having a one hundred ten degree curved gasket length that is about 4.278 inches long with a plan view gasket centerline radius of curvature of 0.825 inch. Alternative embodiments include gaskets having a different length, a different curved path bend angle, a different centerline radius of curvature, combinations thereof, etc. depending, for example, on the particular location and gap in which the gasket will be installed.

Figure 3:
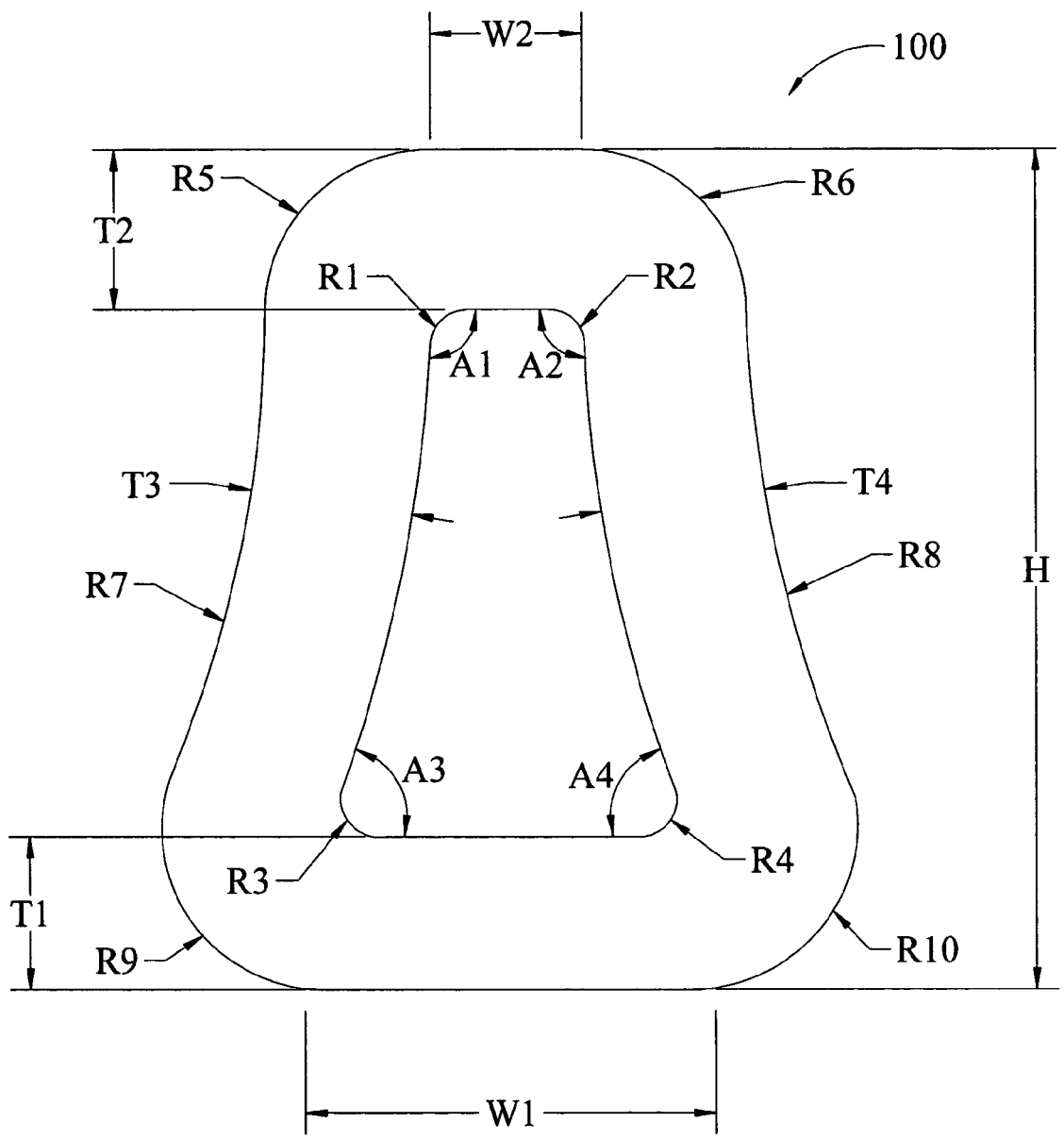
FIG. 3 is another end elevation view of the gasket profile shown in FIG. 2 with reference characters identifying various dimensional parameters that are disclosed hereinafter for purposes of illustration only according to exemplary embodiments.

With reference now to FIG. 3, exemplary dimensions will be provided for one particular exemplary embodiment when the gasket 100 is uncompressed. These dimensions are provided (as are all dimensions disclosed herein) as mere examples for purposes of illustration only. In other embodiments, a gasket can be configured with different dimensions depending, for example, on the particular location at which the gasket is to be used, space considerations, compression requirements, EMI shielding requirements, environmental sealing requirements, differential pressure sealing requirements, combinations thereof, etc.

Continuing with the exemplary embodiment shown in FIG. 3, the gasket 100 may be configured to have the following dimensions:

a height H of about 0.340 inch (with a tolerance of about +/−0.012 inch);

a width W1 of about 0.275 inch (with a tolerance of about +/−0.010 inch);

a width W2 of about 0.060 inch (with a tolerance of about +/−0.005 inch);

a thickness T1 of about 0.062 inch (with a tolerance of about +/−0.005 inch);

a thickness T2 of about 0.065 inch (with a tolerance of about +/−0.005 inch);

a thickness T3 of about 0.065 inch (with a tolerance of about +/−0.005 inch);

a thickness T4 of about 0.065 inch (with a tolerance of about +/−0.005 inch);

a radius of curvature R1 of about 0.015 inch (with a tolerance of about +/−0.005 inch);

a radius of curvature R2 of about 0.015 inch (with a tolerance of about +/0.005 inch);

a radius of curvature R3 of about 0.015 inch (with a tolerance of about +/−0.005 inch);

a radius of curvature R4 of about 0.015 inch (with a tolerance of about +/0.005 inch);

a radius of curvature R5 of about 0.065 inch (with a tolerance of about +/−0.005 inch);

a radius of curvature R6 of about 0.065 inch (with a tolerance of about +/−0.005 inch);

a radius of curvature R7 of about 0.567 inch (with a tolerance of about +/0.100 inch);

a radius of curvature R8 of about 0.567 inch (with a tolerance of about +/−0.100 inch);

a radius of curvature R9 of about 0.065 inch (with a tolerance of about +/−0.005 inch);

a radius of curvature R10 of about 0.065 inch (with a tolerance of about +/−0.005 inch);

an angle A1 of about 92.9 degrees (with a tolerance of about +/−3 degrees);

an angle A2 of about 92.9 degrees (with a tolerance of about +/−3 degrees);

an angle A3 of about 70.5 degrees (with a tolerance of about +/−3 degrees);

an angle A4 of about 70.5 degrees (with a tolerance of about +/−3 degrees); and a cross-sectional area of about 0.05447 square inches.

In order to further illustrate various aspects of the present disclosure and possible advantages thereof, the following non-limiting modeling and test results are given for purposes of illustration. This modeling behavior and test results are provided to help illustrate various aspects of the gasket embodiments disclosed herein.

FIGS. 4A through 4D are graphical illustrations of a finite element model showing, in cross-section, predicted strain distributions for various stages as the gasket 100 is compressed between generally parallel and opposite substrate surfaces 136 and 140. For this particular modeling example, the gasket's base member 124 was adhesively attached to the lower substrate surface 140, and the gasket 100 is being compressed by the upper substrate surface 136 engaging the gasket's top member 120 with zero shear motion.

Figure 4A:
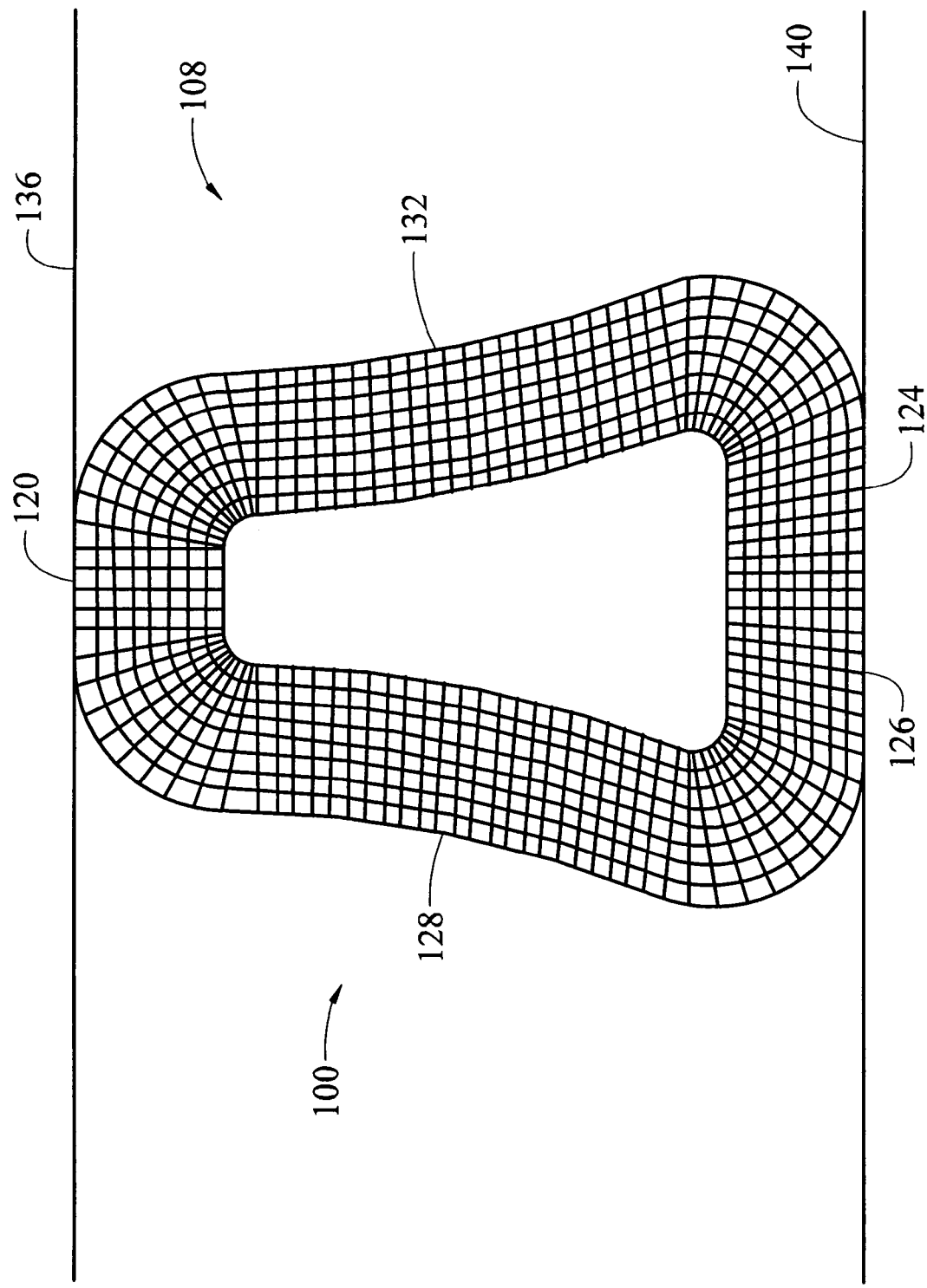
FIGS. 4A through 4D are graphical representations of a finite element model showing, in cross-section, predicted strain distributions for various stages of the gasket shown in FIG. 1 being compressed between generally parallel and opposite substrate surfaces.
Figure 4B:
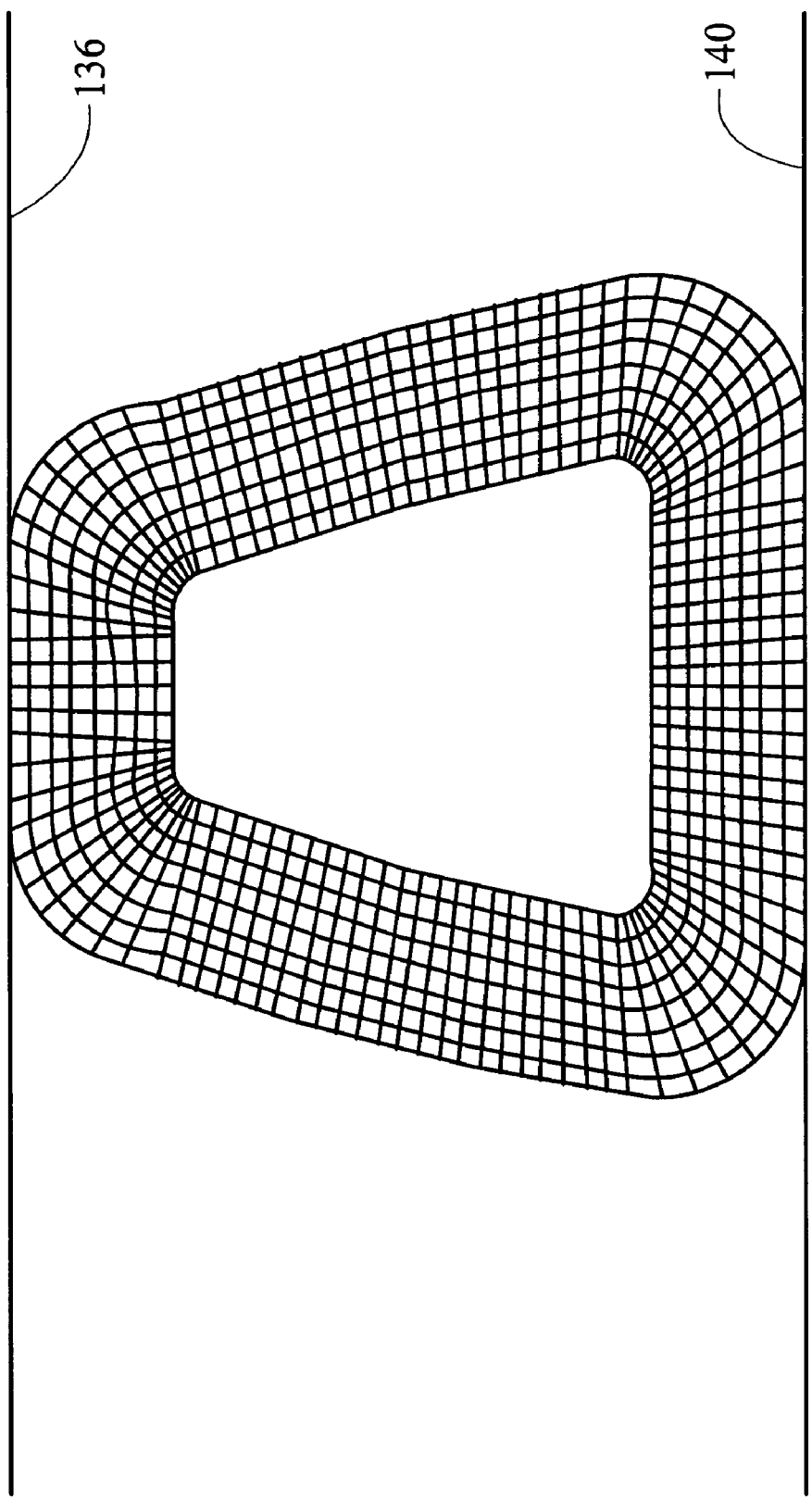
Figure 4C:
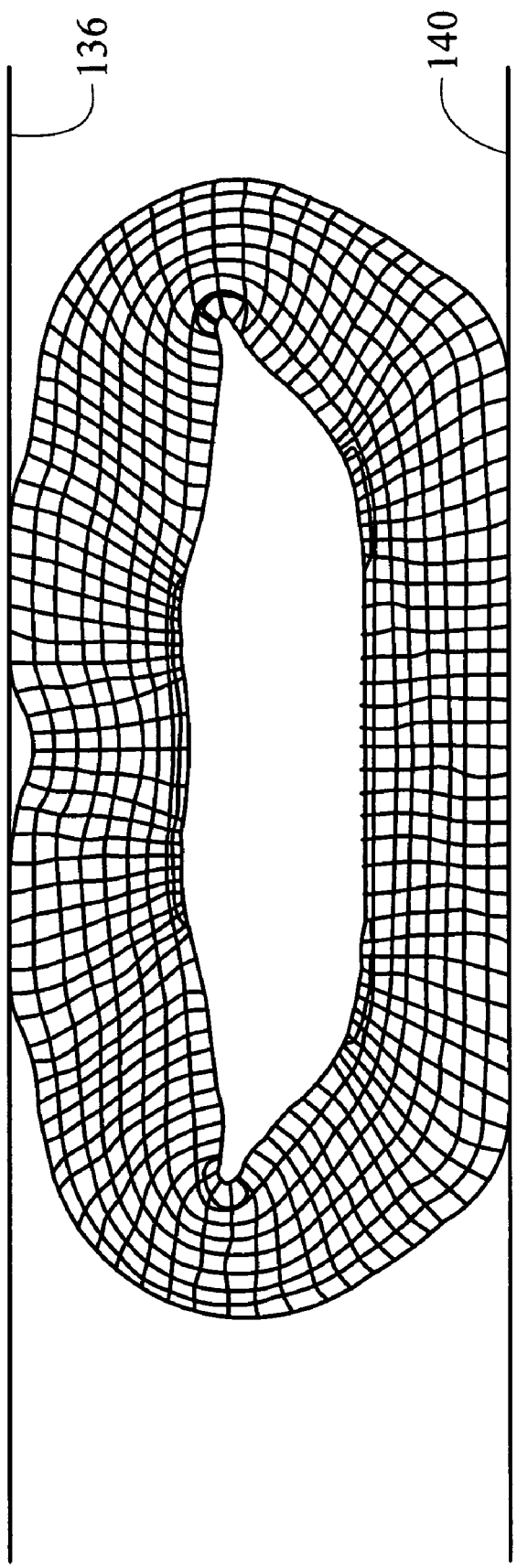
Figure 4D:
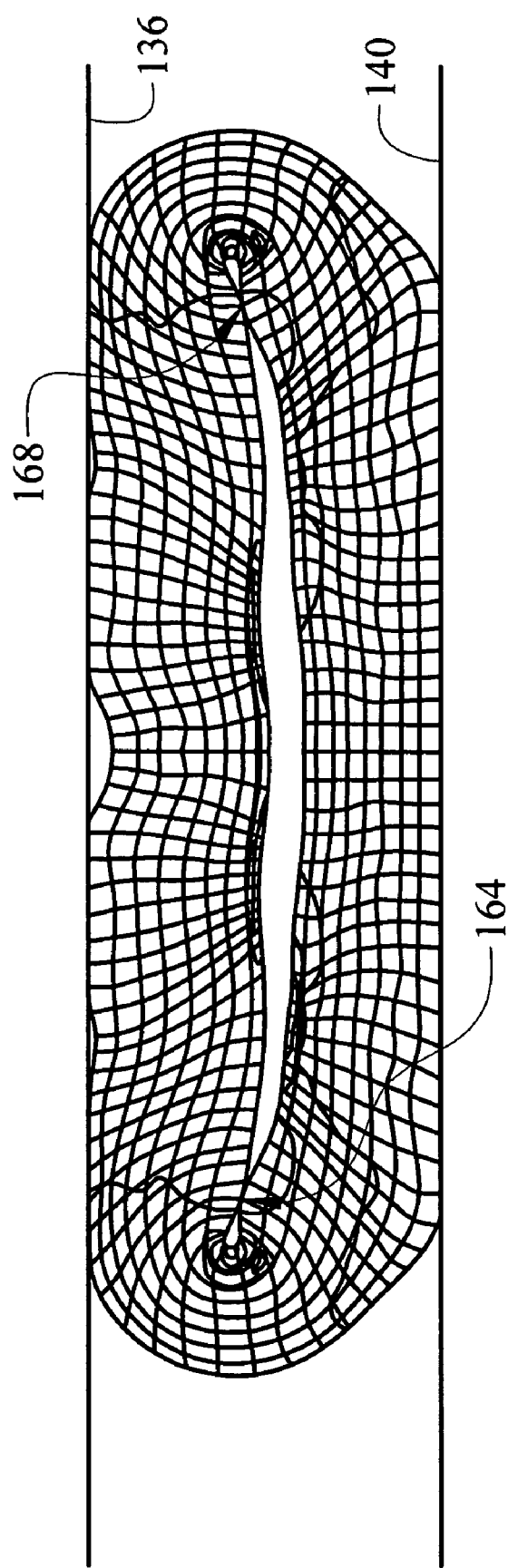

Generally, FIG. 4A shows the gasket 100 in an uncompressed free-standing orientation. FIG. 4D shows the gasket 100 in a collapsed orientation as compressed between the substrate surfaces 136 and 140 at a predetermined gap of 0.134 inch, resulting in a compressive force of about twenty pounds per inch of gasket length. FIGS. 4B and 4C show intermediate gasket compression stages.

In these FIGS. 4A through 4D, the gasket 100 was modeled with an adhesive bonding the outer surface 126 of the gasket's base member 124 to the lower substrate surface 140, where the adhesive has infinite peel strength and infinitesimal thickness. It was also assumed that the upper and lower substrate surfaces 136 and 140 were perfectly rigid. It was further assumed that the gasket 100 was softened or conditioned after repeated compression a few times, but has not taken any permanent reduction in free height as a result. Other assumptions included that no gasket strain occurs along the length of the gasket, such that the analysis disregarded the tendency of gasket length to increase during compression and the complex deformation behavior that typically occurs at vulcanized miter joints or along curved gasket paths. The friction coefficient between all surfaces was assumed to be 0.6.

Looking initially to FIG. 4A, the gasket 100 has a generally trapezoidal profile 108 when uncompressed and free-standing. This generally trapezoidal profile 108 is collectively defined by the gasket's top member 120, base member 124, and lateral members 128, 132. FIGS. 4B and 4C show the manner in which the lateral members 128, 132 change configuration as the gasket 100 is being compressed between the substrate surfaces 136 and 140. The lateral members 128, 132 initially have a generally convex curvature relative to each other, as shown in FIG. 4A. But as the gasket 100 compresses, medial portions of the lateral members 128, 132 move outwardly away from each other. As shown in FIG. 4B, the lateral members 128, 132 are substantially straight, generally acting like columns to bring gasket force quickly up to a functional level. But with continued gasket compression, the lateral members 128, 132 eventually begin to bow outwardly as shown in FIG. 4C, thereby minimizing (or at least reducing) increases in gasket force by forcing the lateral members 128, 132 to carry more of this force in bending and less in axial compression.

Ultimately, the gasket 100 when sufficiently compressed will transform into the collapsed orientation shown in FIG. 4D. This collapsed orientation is characterized in that upper and lower inner surface portions of the first lateral member 128 are in an abutting, force transferring relationship with each other (as generally designated by reference number 164), and upper and lower inner surface portions of the second lateral member 132 are in an abutting, force transferring relationship with each other (as generally designated by reference number 168). Also shown in FIG. 4D, outer surface portions of the respective lateral members 128, 132 are in contact with the upper substrate surface 136.

Figure 7A:
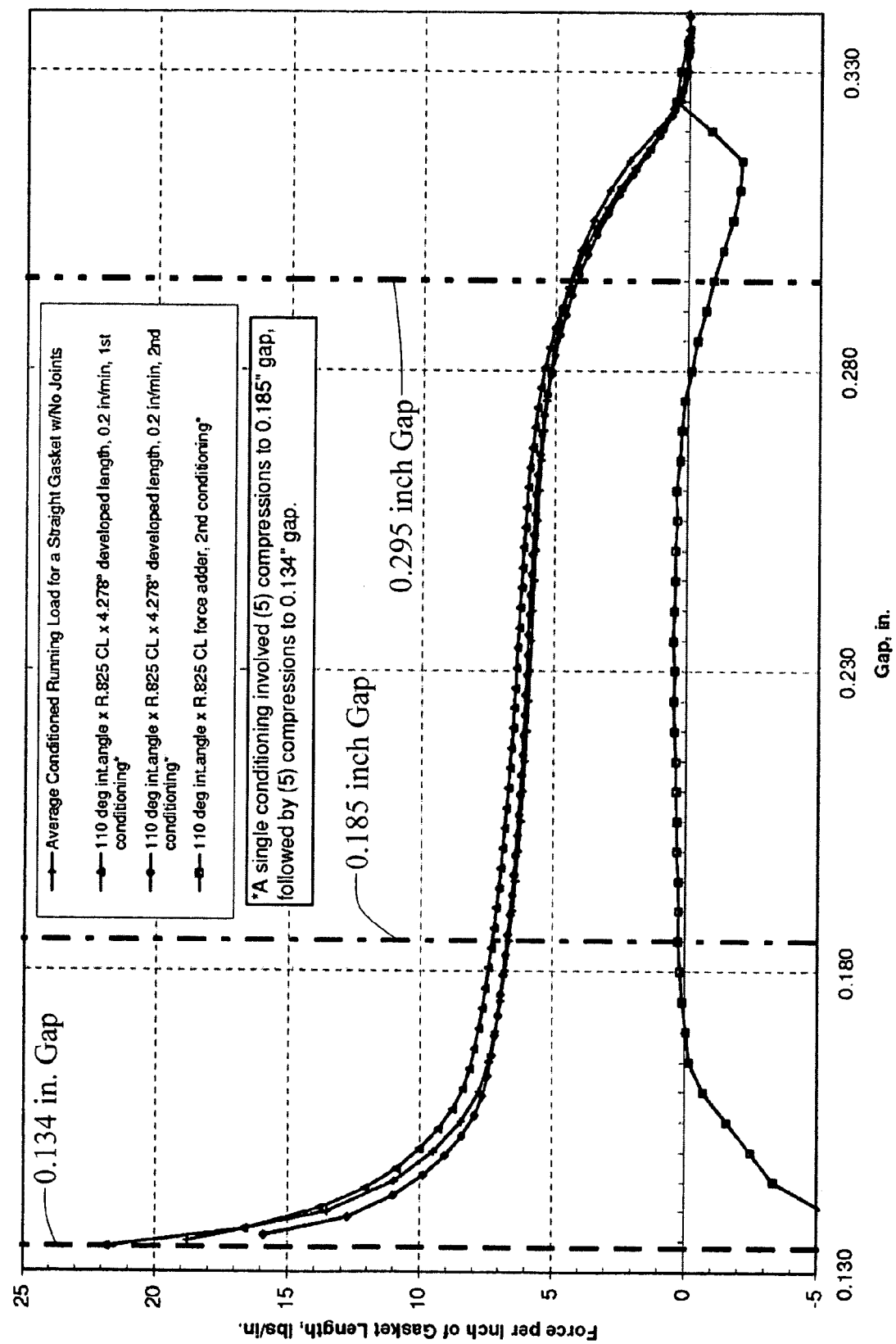
FIGS. 7A and 7B are exemplary line graph of force versus deflection behavior showing gasket force per inch of gasket length at different gap sizes for the relatively straight gasket length shown in FIG. 1, and for the curved gasket lengths shown in FIGS. 5 and 6.
Figure 7B:
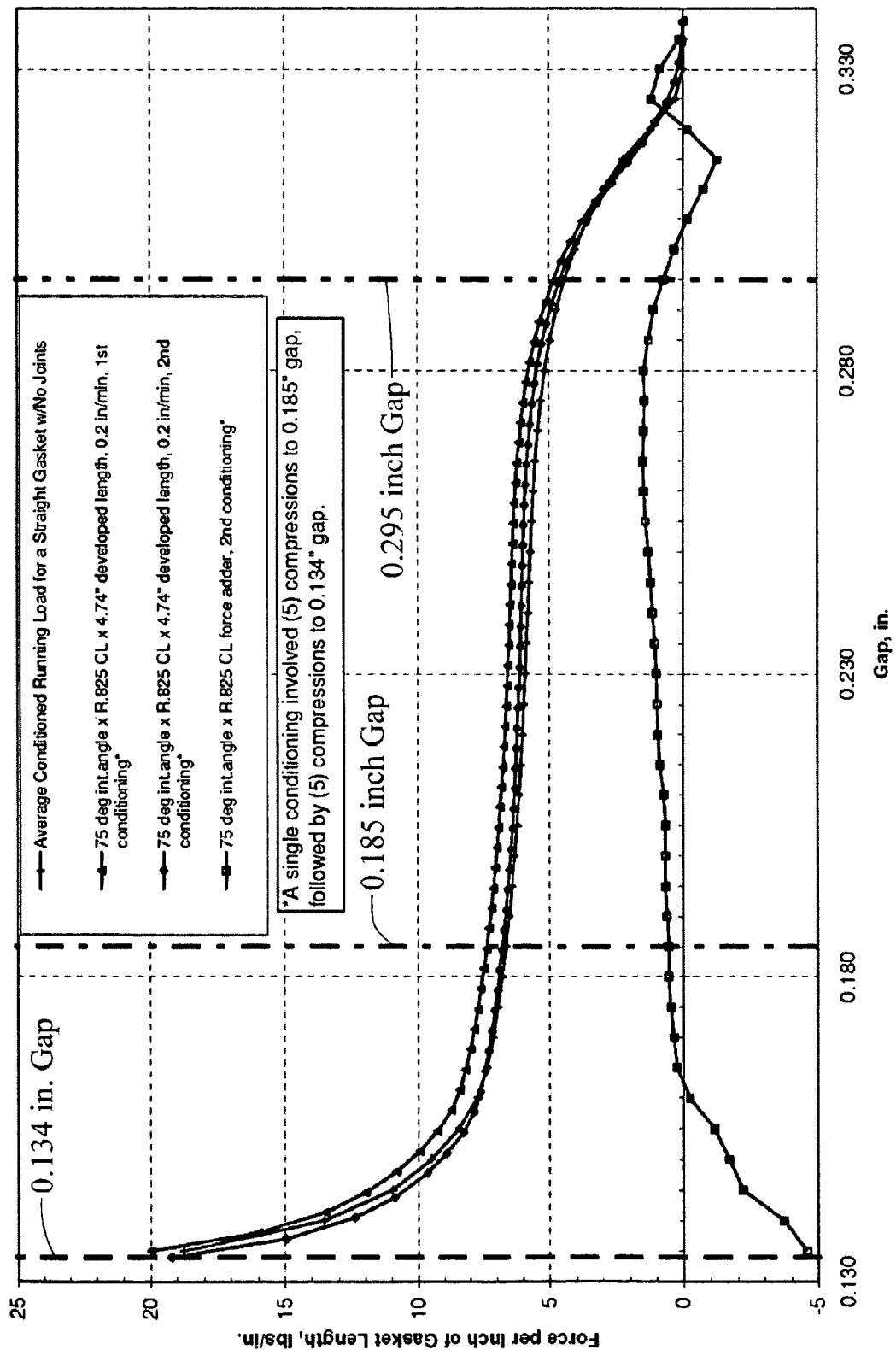

FIGS. 7A and 7B are exemplary line graphs of gasket force per inch of gasket length versus gap size for the relatively straight gasket length shown in FIG. 1, the seventy-five degree curved gasket length shown in FIG. 5, and the one hundred ten degree curved gasket length shown in FIG. 6. As can be seen in FIGS. 7A and 7B, the gasket force remains relatively constant over a fairly large deflection range. Accordingly, the gasket force per inch of gasket length over a predetermined compression range has a general shape characterized by three slope regions, including a fairly quick ramp-up to functional force starting from the free height of the gasket, followed by relatively constant force over a large compression range (e.g., approximately one-third of the free gasket height or about 0.280 inch gap down to about 0.165 inch gap), and then followed by an inevitable and relatively quick ramp-up in force as the gasket begins abutting itself (e.g., as shown by areas 164 and 168 in FIG. 4, etc.). In some preferred embodiments, the gasket is configured such that the gasket force per inch length does not change by more than about sixty percent for a range of compression from a gap of about eighty-two percent of the free gasket height (e.g., 0.280 inch gap in some embodiments, etc.) down to a gap of about forty-nine percent of the free gasket height (e.g., 0.165 inch gap in some embodiments, etc.). In addition, some embodiments include a gasket configured such that the gasket exhibits a force at a gap of 0.165 inch that is about fifty percent higher than the force at a 0.280 gap.

These aspects and features relating to constancy of gasket force over a large range of compression is what helps allow various embodiments of the gasket 100 to be able to seal against an air pressure differential of at least about 6.4 pounds per square inch when the gasket is compressed to a gap size between about 0.295 inch to about 0.185 inch, and also to seal against an air pressure differential of at least about 8.6 pounds per square inch without exceeding a gasket force of about thirty-two pounds per inch of gasket length when the gasket is compressed to a gap size between about 0.185 inch to about 0.134 inch. In cases where the sealing of a pressure differential is not required or necessary, the constancy of gasket force over a relatively large deflection range can also provide a reliable seal against the transfer of such materials as driven rain, dust, pooled liquids, gases, etc, especially in situations where gasket gap cannot be precisely controlled, and without overstressing assembly components or making it hard to close doors, etc.

Also shown in FIGS. 7A and 7B, the "force adder" curves generally show that making the gasket 100 follow a curved path (e.g., seventy-five degree curved gasket length (FIG. 5), one hundred ten degree curved gasket length (FIG. 6), etc.) has only a small effect on the gasket force. By way of background, a "force adder" is the gasket force per unit length for a curved gasket section minus the gasket force per unit length for a straight gasket section. In other words, gluing or adhesively attaching the gasket 100 down into a curved path changes the load versus deflection behavior a little or insignificantly. This testing was performed on the two different curved paths shown in FIGS. 5 and 6. More specifically, FIG. 5 shows a curved path of seventy-five degrees where the total gasket length was 4.74 inches with a plan view gasket centerline radius of curvature of 0.825 inch. FIG. 6 shows a curved path of one hundred ten degrees where the total gasket length was 4.278 inches with a plan view gasket centerline radius of curvature of 0.825 inch. As shown by FIG. 7, curving the gasket's path did not significantly change the overall gasket performance.

Figure 8:
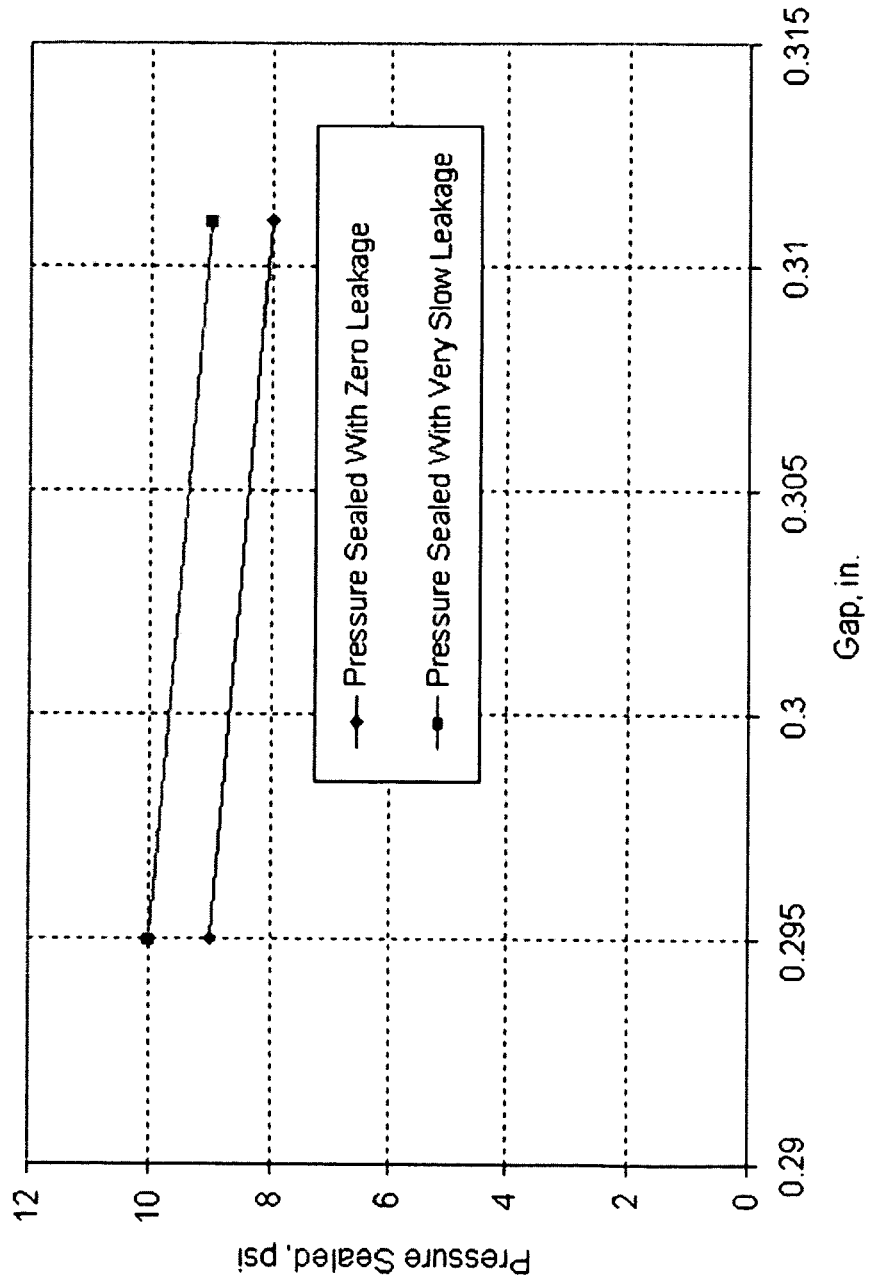
FIG. 8 is an exemplary line graph depicting data acquired from pressure testing that illustrates the ability of the gasket shown in FIG. 1 to seal against a pressure differential at different gap sizes.

FIG. 8 is an exemplary line graph depicting data acquired by pressure testing the gasket 100 after the gasket 100 was compressed to a height of 0.137 inch six times and released completely after each compression. This graph generally illustrates the ability of the gasket 100 to seal against relatively large pressure differentials over a relatively large range of compression with a gap size ranging between 0.295 inch and 0.311 inch.

As shown by the pressure testing results in FIG. 8, the gasket 100 sealed a 0.295 inch gap against a pressure differential of about 8.5 psi with zero leakage and about 10 psi with very slow leakage. FIG. 8 also shows that the gasket 100 sealed a 0.311 inch gap against a pressure differential of about 8 psi with zero leakage and about 8.5 psi with very slow leakage.

FIG. 8 does not illustrate pressure testing results for the gasket 100 at gap sizes less than 0.295 inch. But the gasket 100 should seal against pressure differentials of 8.5 psi or higher when the gasket 100 is compressed within gaps less than 0.295 inch. This is because prior testing has shown a trend for gaskets (including testing of gasket 200 described below), where increasing compression due to decreasing gap size led to greater sealing capacity. Therefore, increasing the gasket force as a result of greater compression within a smaller gap size should increase the gasket's sealing ability.

Figure 9:
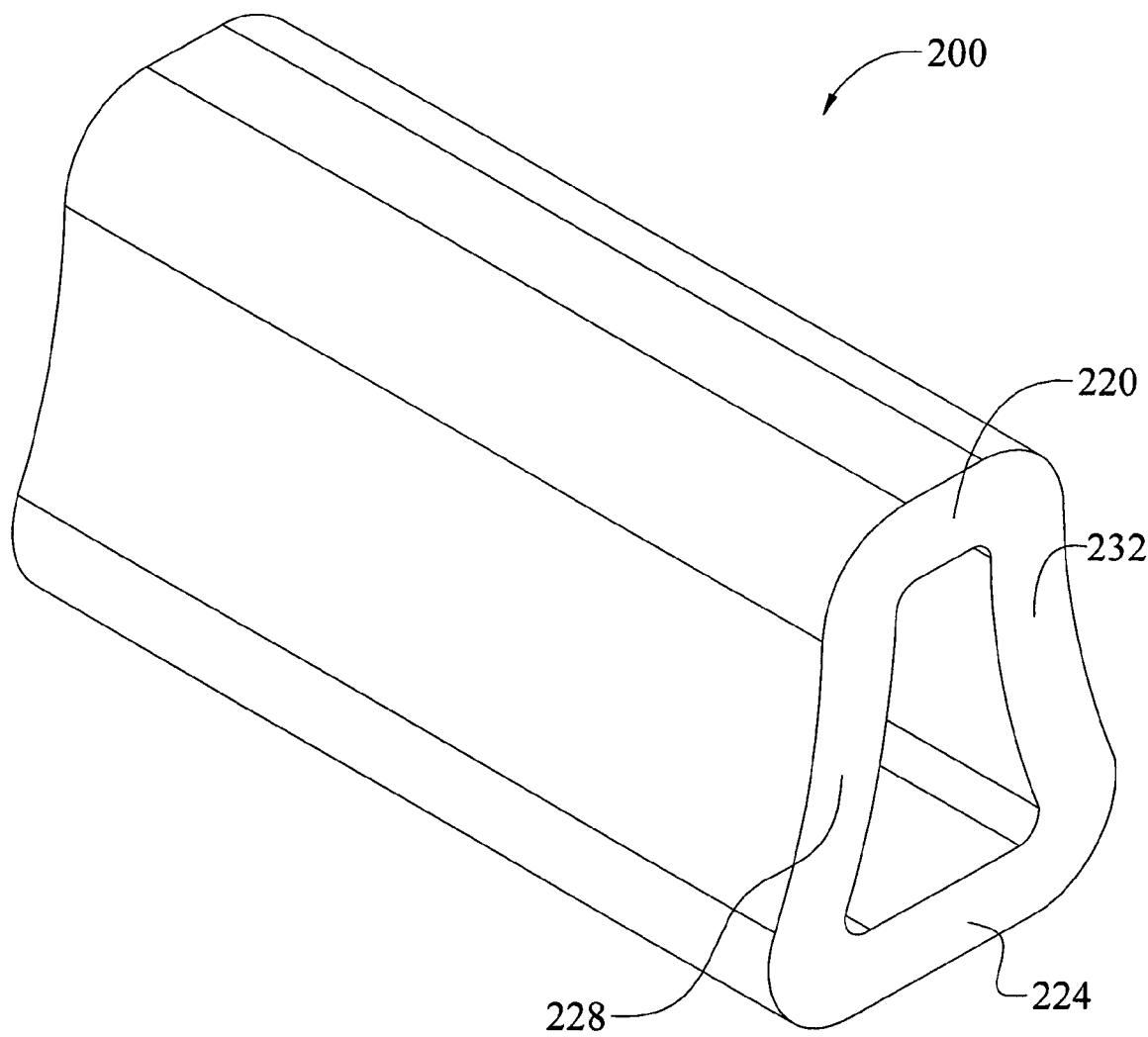
FIG. 9 is a perspective end view of another embodiment of an EMI shielding and/or environmental sealing gasket according to exemplary embodiments.
Figure 10:
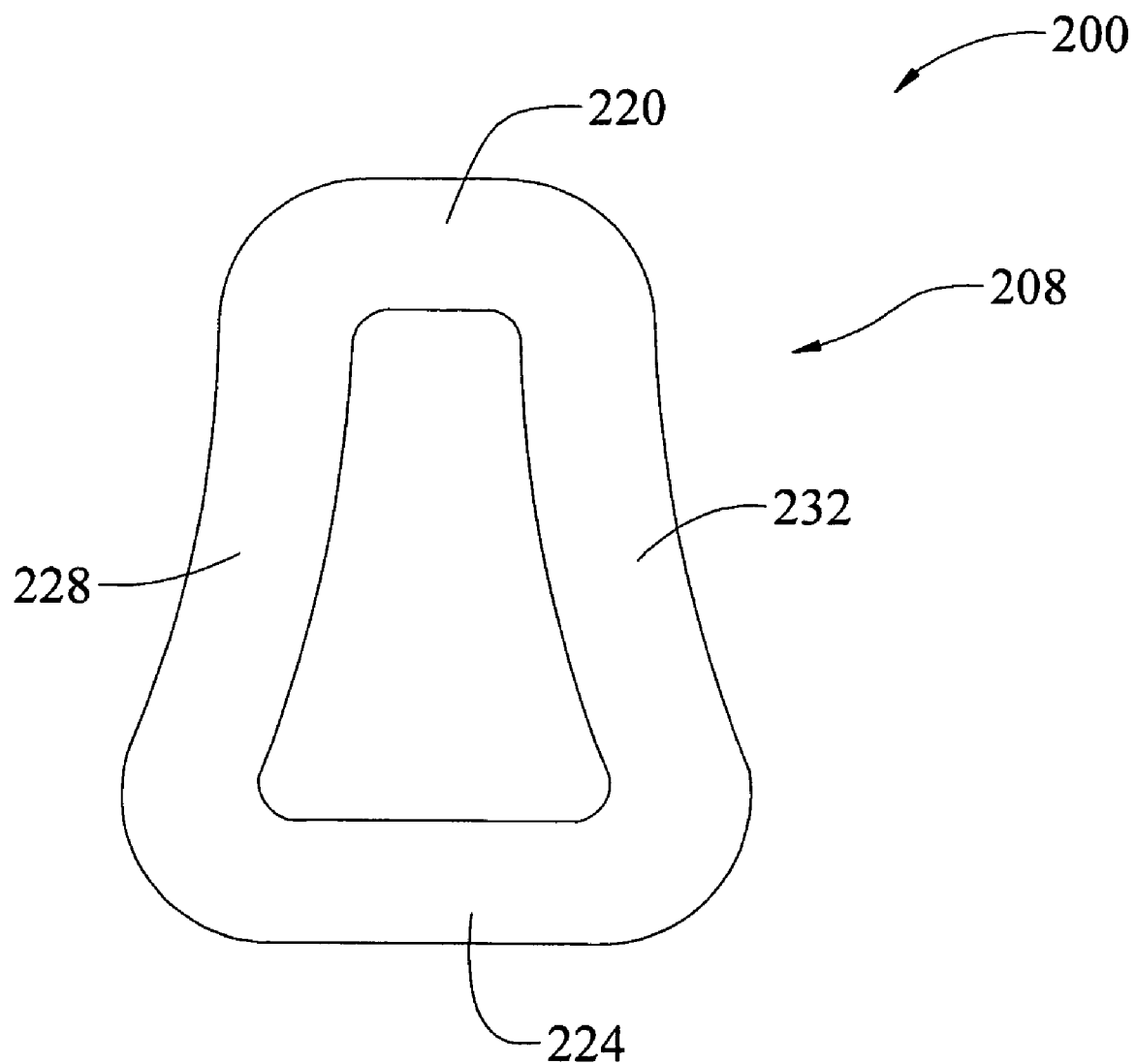
FIG. 10 is an end elevation view of the gasket shown in FIG. 9.

FIGS. 9 and 10 illustrate an alternative embodiment of a gasket 200. By way of comparison to gasket 100, the gasket 200 may be thinner walled for some embodiments. Topologically, however, the gaskets 100 and 200 may have substantially similar generally trapezoidal profiles. The gaskets 100 and 200 are substantially similar proportionally but their general proportions may vary in scale. In this regard, various embodiments may include gaskets having dimensions scaled upwards or downwards depending, for example, on the particular needs of an application or customer, while generally maintaining the same general proportions as disclosed for gasket 100 or 200.

By way of example, the illustrated embodiment of gasket 200 includes a top member 220, a base member 224, and first and second lateral members 228, 232. These four members 220, 224, 228, 232 cooperatively define the approximately trapezoidal gasket profile 208. As shown in FIG. 10, the base member 224 is wider than the top member 220. The first and second lateral members 228 and 232 are bowed, arced, or curved slightly inwardly relative to each other.

Depending on the particular application, the profile of the gasket 200, however, may prove advantageous in that the cross-sectional area thereof may be less than the cross-sectional area of some embodiments of the gasket 100, which may, in turn, allow for gasket production with less material. By way of example, one particular embodiment of the gasket 200 is configured such that its cross-sectional area is about 0.05 square inches, as compared to an exemplary embodiment of the gasket 100 having a cross-sectional area of about 0.05447 square inches. These dimensions (as are all dimensions herein) are provided for purposes of illustration only. Alternatively, other cross-sectional areas can be employed for the gasket 100 or gasket 200.

Figure 11:
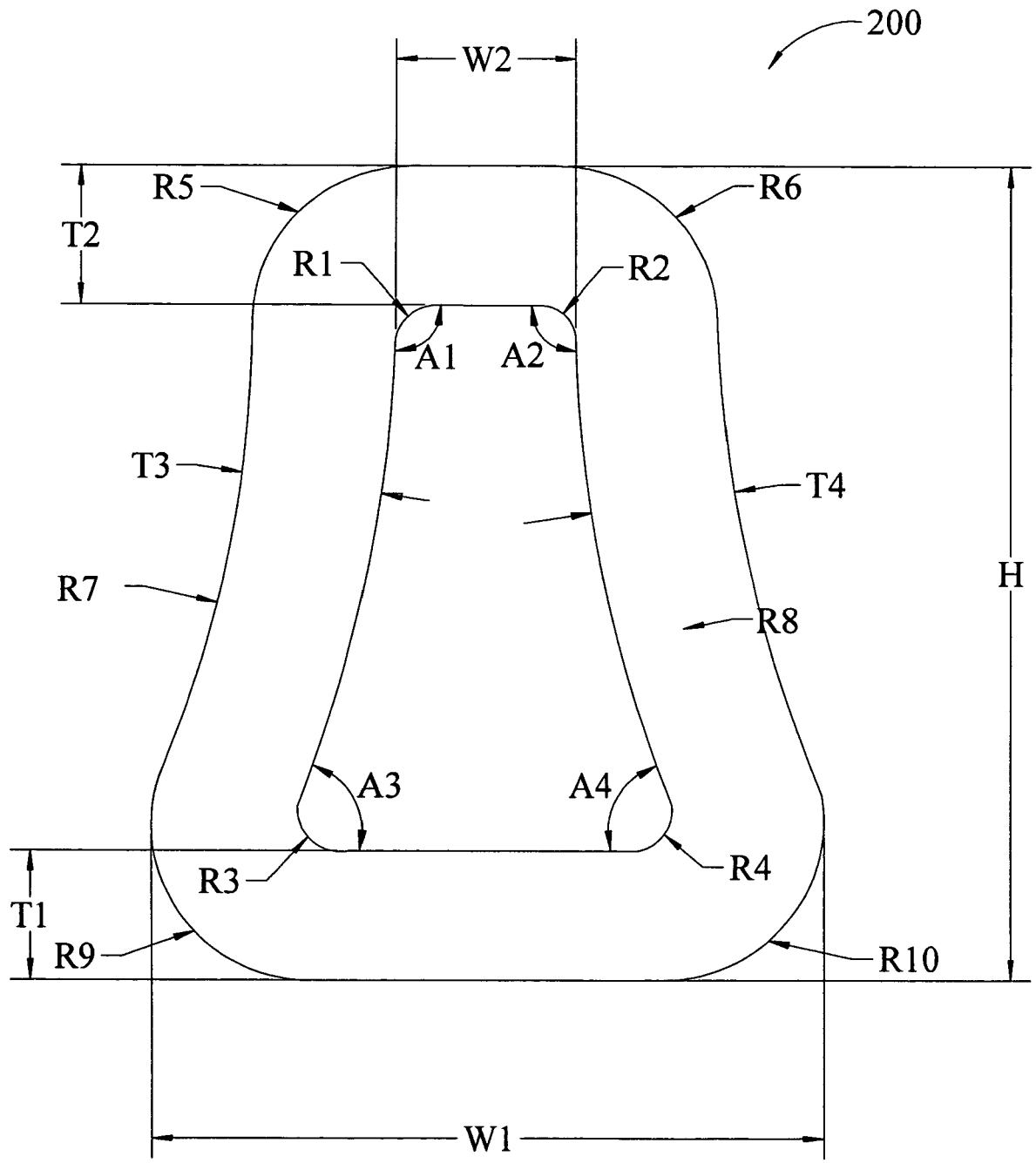
FIG. 11 is another end elevation view for the gasket profile shown in FIG. 2 with reference characters identifying various dimensional parameters that are disclosed hereinafter for purposes of illustration only according to exemplary embodiments.

With reference to FIG. 11, exemplary dimensions will now be provided for one particular embodiment when the gasket 200 is uncompressed or free-standing. These dimensions are provided (as are all dimensions disclosed herein) as mere examples for purposes of illustration only. In other embodiments, a gasket can be configured with different dimensions depending, for example, on the particular location at which the gasket is to be used, space considerations, compression requirements, EMI shielding requirements, environmental sealing requirements, differential pressure sealing requirements, combinations thereof, etc.

Continuing with the exemplary embodiment shown in FIG. 11 the gasket 200 may have the following dimensions:
 a height H of about 0.340 inch (with a tolerance of about +/−0.012 inch);
 a width W1 of about 0.275 inch (with a tolerance of about +/−0.010 inch);
 a width W2 of about 0.060 inch (with a tolerance of about +/−0.005 inch);
 a thickness T1 of about 0.055 inch (with a tolerance of about +/−0.005 inch);
 a thickness T2 of about 0.058 inch (with a tolerance of about +/−0.005 inch);
 a thickness T3 of about 0.058 inch (with a tolerance of about +/−0.005 inch);
 a thickness T4 of about 0.058 inch (with a tolerance of about +/−0.005 inch);
 a radius of curvature R1 of about 0.015 inch (with a tolerance of about +/−0.005 inch);
 a radius of curvature R2 of about 0.015 inch (with a tolerance of about +/−0.005 inch);
 a radius of curvature R3 of about 0.015 inch (with a tolerance of about +/−0.005 inch);
 a radius of curvature R4 of about 0.015 inch (with a tolerance of about +/0.005 inch);
 a radius of curvature R5 of about 0.065 inch (with a tolerance of about +/−0.005 inch);
 a radius of curvature R6 of about 0.065 inch (with a tolerance of about +/−0.005 inch);
 a radius of curvature R7 of about 0.567 inch (with a tolerance of about +/−0.100 inch);
 a radius of curvature R8 of about 0.567 inch (with a tolerance of about +/−0.100 inch);
 a radius of curvature R9 of about 0.065 inch (with a tolerance of about +/−0.005 inch);
 a radius of curvature R10 of about 0.065 inch (with a tolerance of about +/−0.005 inch);
 an angle A1 of about 92.3 degrees (with a tolerance of about +/−3 degrees);
 an angle A2 of about 92.3 degrees (with a tolerance of about +/−3 degrees);
 an angle A3 of about 69.4 degrees (with a tolerance of about +/−3 degrees);
 an angle A4 of about 69.4 degrees (with a tolerance of about +/−3 degrees); and
 a cross-sectional area of about 0.05 square inches.

Figure 12:
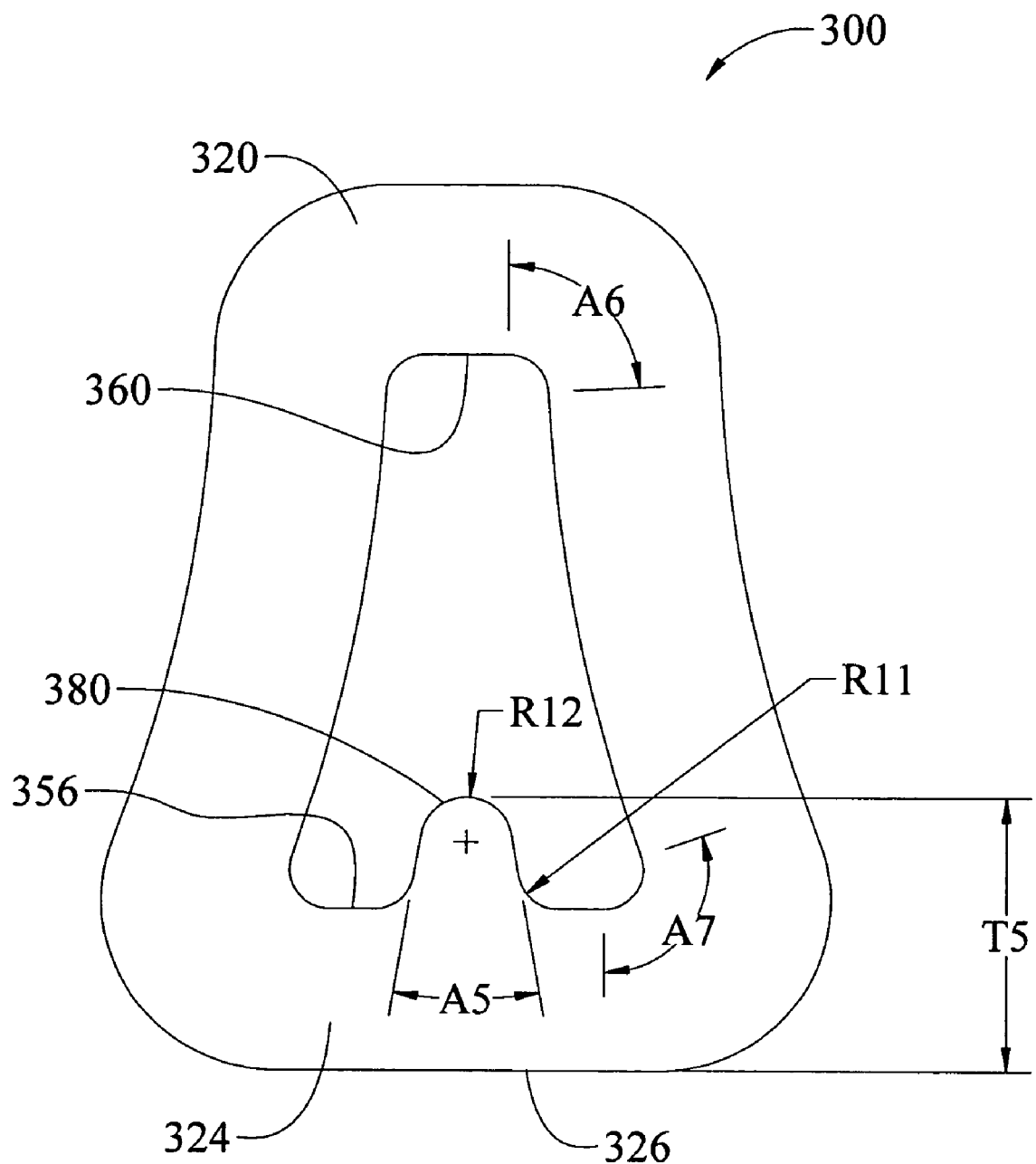
FIG. 12 is a perspective end view of another embodiment of an EMI shielding and/or environmental sealing gasket according to exemplary embodiments.

FIG. 12 illustrates an alternative embodiment of a gasket 300. In this particular embodiment, the gasket 300 includes a protruding portion or bearing member 380. The protruding portion 380 extends generally from the inner surface 356 of the base member 324, and towards the inner surface 360 of the top member 320. Advantageously, the protruding portion 380 may be configured to contact the inner surface 360 of the top member 320, at the low end of compression in order to prevent or at least inhibit the base member's outer surface 326 from arcing up and/or pealing away from a substrate surface. Alternative embodiments may include one or more protruding portions extending from the inner surface of the top member instead of, or in addition, to one or more protruding portions extending from the inner surface of the base member.

In some embodiments, one or both of the inner surfaces of the top member and the base member may be configured as having an area of enlarged wall thickness that defines a protruding portion or bearing member. The bearing member may extend axially along at least a portion of the length of the gasket, and extend inwardly from the corresponding inner surface to a distal end disposable in the gasket's collapsed orientation in an abutting, force transferring relationship with the other one of the inner surfaces.

With continued reference to FIG. 12, exemplary dimensions will now be provided for one particular embodiment when the gasket 300 is uncompressed or free-standing. These dimensions are provided (as are all dimensions disclosed herein) as mere examples for purposes of illustration only. In other embodiments, a gasket can be configured with different dimensions depending, for example, on the particular location at which the gasket is to be used, space considerations, compression requirements, EMI shielding requirements, environmental sealing requirements, differential pressure sealing requirements, combinations thereof, etc.

Continuing with the exemplary embodiment shown in FIG. 12 the gasket 300 may be configured with the same or similar dimensions as gasket 100 or 200. Alternatively, the gasket 300 may be configured with different dimensions. For example, the gasket 300 may topologically be substantially similar proportionally to gasket 100 or 200, but gasket 300 may be larger or smaller in scale.

In addition, one particular embodiment of the gasket 300 has the following dimensions:
   a thickness T5 of about 0.105 inch (with a tolerance of about +/−0.010 inch); a
   a radius of curvature R11 of about 0.015 inch (with a tolerance of about +/−0.005 inch);
   a radius of curvature R12 of about 0.018 inch (with a tolerance of about +/−0.005 inch);
   an angle A5 of about 20.0 degrees (with a tolerance of about +/−3 degrees);
   an angle A6 of about 87.0 degrees (with a tolerance of about +/−3 degrees); and
   an angle A5 of about 109.0 degrees (with a tolerance of about +/−3 degrees).

Accordingly, various embodiments disclosed herein provide gaskets having the capability to respond to a large compression range with relatively constant and sufficient force. Such gaskets may also be minimized or at least reduced in size, thereby allowing for material cost savings and assembly fit. Some additional advantages of the gasket embodiments disclosed herein profile include a large but controlled deflection and uniform interface contact with the base substrate for more assured electrical and physical continuity and, in turn, more reliable EMI shielding and environmental sealing effectiveness. Various embodiments provide gaskets having a generally trapezoidal tubular extrusion gasket profile that are capable of sealing against EMI and air pressure differentials of at least 6.4 pounds per square inch when compressed to a gap of 0.295 inch, and at least 8.6 pounds per square inch when compressed to a gap at 0.185 inch and 0.134 inch gap. In such embodiments, the gaskets also did not exceed thirty-two pounds of gasket force per inch gasket length over the compression range, even then compressed to a gap of 0.134 inch gap. Such gaskets may also be configured such that their base members may be mounted to a surface with adhesive or other suitable attachment means. The advantages set forth in this paragraph may be realized by some embodiments, but are not requirements for all embodiments.

Certain terminology is used herein for purposes of reference only, and thus is not intended to be limiting. For example, terms such as "upper", "lower", "above", and "below" refer to directions in the drawings to which reference is made. Terms such as "front", "back", "rear", "bottom" and "side", describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order or performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A gasket deflectable into a collapsed orientation between first and second surfaces, the gasket comprising a resilient, electrically-conductive tubular body of indefinite length, the tubular body having a generally continuous interior and exterior surface defining a wall thickness therebetween and including:
   a base member, a top member, and first and second lateral members, the top member having a narrower width than the base member, the first and second lateral members curving slightly inwardly relative to each other and connecting the base member to the top member such that the gasket has a generally trapezoidal profile collectively defined by the first and second lateral members, base member, and top member;
   wherein the gasket is configured to seal against EMI and an air pressure differential of at least about 6.4 pounds per square inch when the base member is secured with adhesive to the second surface and the first surface is engaging the top member and compressing the gasket to a gap between about 0.295 inch to about 0.185 inch; and
   wherein the gasket is configured to seal against EMI and an air pressure differential of at least about 8.6 pounds per square inch without exceeding a gasket force of about thirty-two pounds per inch of gasket length when the base member is secured with adhesive to the second surface and the first surface is engaging the top member and compressing the gasket to a gap between about 0.185 inch to about 0.134 inch.

2. The gasket of claim 1, wherein the base member is secured with adhesive to the second surface, and wherein the first surface is engaged with the top member such that the gasket is compressed to a gap of about 0.295 inch and sealing against both EMI and an air pressure differential of at least about 6.4 pounds per square inch.

3. The gasket of claim 1, wherein the base member is secured with adhesive to the second surface, and wherein the first surface is engaged with the top member such that the gasket is compressed to a gap of about 0.134 inch and sealing against both EMI and an air pressure differential of at least about 8.6 pounds per square inch without exceeding a gasket force of about thirty-two pounds per inch of gasket length.

4. A gasket comprising:
a base member having an inner surface and an outer surface;
a top member having an inner surface and an outer surface;
first and second oppositely-disposed lateral members curving generally inwardly relative to each other and connecting the base member to the top member such that a spaced distance separates the base member's inner surface from the top member's inner surface; and
the first and second lateral members, base member, and top member collectively defining a generally trapezoidal profile with four generally rounded corner portions at about the intersections of the first and second lateral members with the base member and top member;
wherein:
the gasket is configured to seal against EMI and an air pressure differential of at least about 6.4 pounds per square inch when the base member is secured with adhesive to a first surface and a second surface is engaging the top member and compressing the gasket to a gap between about 0.295 inch to about 0.185 inch; and
the gasket is configured to seal against EMI and an air pressure differential of at least about 8.6 pounds per square inch without exceeding a gasket force of about thirty-two pounds per inch of gasket length when the base member is secured with adhesive to the second surface and the first surface is engaging the top member and compressing the gasket to a gap between about 0.185 inch to about 0.134 inch.

5. The gasket of claim 4, wherein the gasket is deflectable into a collapsed orientation between first and second surfaces, and wherein the base member's outer surface is configured to conform to the second surface, with the top member's outer surface generally parallel with the first surface.

6. The gasket of claim 4, wherein the base member's outer surface is substantially flat, and wherein the top member's outer surface is substantially flat and generally parallel with the base member's outer surface.

7. The gasket of claim 4, wherein the gasket is configured such that the gasket force per inch length does not change by more than about sixty percent for a range of compression from a gap of about eighty-two percent of the free gasket height down to a gap of about forty-nine percent of the free gasket height.

8. The gasket of claim 4, wherein at least one of the top member and the base member includes at least one protruding portion extending generally outwardly from the inner surface thereof towards the inner surface of the other one of said top member and base member for contact therewith when the gasket is deflected into a collapsed orientation.

9. The gasket of claim 4, wherein the gasket is deflectable under a predetermined range of gaps between first and second surfaces into a collapsed orientation characterized in that substantially continuous contact is maintained between the outer surface of the base member and the second surface.

10. The gasket of claim 9, wherein the predetermined range of gaps is from about 0.134 inch to about 0.295 inch.

11. The gasket of claim 4, wherein the gasket is deflectable under a predetermined range of gaps from about 0.134 inch to about 0.295 inch between first and second surfaces into a collapsed orientation characterized in that the first and second lateral members transition from being curved generally inwardly and bow generally outwardly away from each other as the gasket transitions into the collapsed orientation.

12. The gasket of claim 4, wherein the gasket has a generally uniform wall thickness.

13. The gasket of claim 4, wherein the wall thickness defined between the inner and outer surfaces of the base member is less than the wall thickness defined between the inner and outer surfaces of the top member.

14. The gasket of claim 4, wherein the wall thickness defined between the inner and outer surfaces of each said first and second lateral member is different than the wall thickness defined between the inner and outer surfaces of the top member.

15. The gasket of claim 4, wherein the gasket is electrically-conductive.

16. The gasket of claim 15, wherein the gasket comprises electrically-conductive elastomer.

17. The gasket of claim 4, wherein the inner radius of curvature for each rounded corner portion is about twenty-three percent of wall thickness, and wherein the outer radius of curvature for the rounded corner portions at the intersections of the top member with the first and second lateral members is within a range of about eighty percent to about one hundred twenty percent of wall thickness.

18. The gasket of claim 4, wherein the first and second lateral members, base member, and top member collectively define a generally trapezoidal profile corresponding to the profile shown in FIG. 2.

19. The gasket of claim 4, wherein the gasket is configured to exhibit a predetermined deformation response corresponding to that shown in FIGS. 4A through 4D when the gasket is deflected between first and second surfaces with the first surface engaging the gasket's top member with zero shear motion and compressing the gasket with a compressive force of about twenty pounds per inch of gasket length.

20. The gasket of claim 4, wherein the gasket is configured such that the gasket force per inch of gasket length over a predetermined compression range has the same general shape as shown in FIG. 7.

21. The gasket of claim 4, wherein the gasket is configured such that the gasket force per inch of gasket length does not exceed about thirty-two pounds for a range of compression from a gap of about 0.295 inch down to a gap of about 0.134 inch.

22. A gasket for interposition between first and second surfaces, the gasket comprising a resilient, tubular body of indefinite length, the tubular body having generally continuous interior and exterior surfaces defining a wall thickness therebetween, and including:
a base member having an inner surface forming a first portion of the interior surface of the body and an outer surface forming a first portion of the exterior surface of the body for contact with the second surface;
a top member narrower in width than the base member, the top member having an inner surface forming a second portion of the interior surface of the body, and an outer surface forming a second portion of the exterior surface of the body for contact with the first surface;

first and second oppositely-disposed lateral members connecting the base member to the top member such that a spaced distance separates the base member's inner surface from the top member's inner surface and such that the base member's outer surface conforms to the second surface, with the top member's outer surface generally parallel to the first surface;

the first and second lateral members extending from corresponding edge portions of the top member to intersect corresponding edge portions of the base member such that the first and second lateral members, base member, and top member collectively define a generally trapezoidal profile having four generally rounded corner portions at about the intersections of the first and second lateral members with the base member and top member;

the first and second lateral members having a generally convex curvature and bowing inwardly relative to each other as the first and second lateral members extend from the top member to intersect the base member;

the first lateral member having an outer surface forming a third portion of the exterior surface of the body, and an inner surface forming a third portion of the interior surface of the body and defining a first angle with the inner surface of the base member and a second angle with the inner surface of the top member; and the second lateral member having an outer surface forming a fourth portion of the exterior surface of the body, and an inner surface forming a fourth portion of the interior surface of the body and defining a third angle with the inner surface of the base member and a fourth angle with the inner surface of the top member.

23. The gasket of claim 22, wherein the first and third angles are each about seventy degrees, and wherein the second and fourth angles are each about ninety three degrees.

24. The gasket of claim 22, wherein the first and third angles are substantially equal and acute, and wherein the second and fourth angles are substantially equal and obtuse.

25. The gasket of claim 22, wherein the gasket is configured such that the gasket force per inch length does not change by more than about sixty percent for a range of compression from a gap of about eighty-two percent of the free gasket height down to a gap of about forty-nine percent of the free gasket height.

* * * * *